United States Patent
Liu et al.

(10) Patent No.: US 7,251,134 B2
(45) Date of Patent: Jul. 31, 2007

(54) EXTENDED FIN ARRAY

(75) Inventors: Dennis Liu, Tao Yuan (TW); Tsan-Nan Chien, Taipei (TW); Yu-Nien Huang, Chung Li (TW); Shun-Ta Yu, Taipei (TW); Cheng-Yu Wang, Hsinchu (TW)

(73) Assignee: Quanta Computer Inc., Tao Yuan Shien (TW)

( * ) Notice: Subject to any disclaimer, the term of this patent is extended or adjusted under 35 U.S.C. 154(b) by 251 days.

(21) Appl. No.: 11/045,303

(22) Filed: Jan. 31, 2005

(65) Prior Publication Data

US 2005/0259398 A1    Nov. 24, 2005

(30) Foreign Application Priority Data

May 18, 2004   (TW) .............................. 93113973 A

(51) Int. Cl.
*H05K 7/20* (2006.01)
*F28F 1/00* (2006.01)

(52) U.S. Cl. ............... 361/695; 165/80.3; 165/185; 165/121; 257/722; 361/703

(58) Field of Classification Search ............ 165/80.3, 165/121; 361/697, 703
See application file for complete search history.

(56) References Cited

U.S. PATENT DOCUMENTS

| | | | |
|---|---|---|---|
| 5,558,155 A * | 9/1996 | Ito | 165/80.3 |
| 6,009,938 A * | 1/2000 | Smith et al. | 165/185 |
| 6,336,498 B1 * | 1/2002 | Wei | 165/80.3 |
| 6,396,693 B1 * | 5/2002 | Shih | 361/703 |
| 6,607,028 B1 * | 8/2003 | Wang et al. | 165/185 |
| 6,672,379 B1 * | 1/2004 | Wang et al. | 165/185 |
| 6,765,799 B1 * | 7/2004 | Huang | 361/709 |
| 6,883,591 B2 * | 4/2005 | Lai | 91/97 |
| 6,901,993 B2 * | 6/2005 | Lee et al. | 165/80.3 |

* cited by examiner

*Primary Examiner*—Gregory D Thompson
(74) *Attorney, Agent, or Firm*—Rabin & Berdo, PC

(57) ABSTRACT

An extended fin array has a main heat-dissipation module and an extended heat-dissipation module. The main heat-dissipation module and the extended heat-dissipation module are stacked to increase the effective convective area to increase the heat-dissipation effect. The extended heat-dissipation module is in the main heat-dissipation module when the heat amount generated by an electronic device is normal. The extended heat-dissipation module extends out from the main heat-dissipation module to increase the heat convection area when the heat amount generated by the electronic device is large.

8 Claims, 6 Drawing Sheets

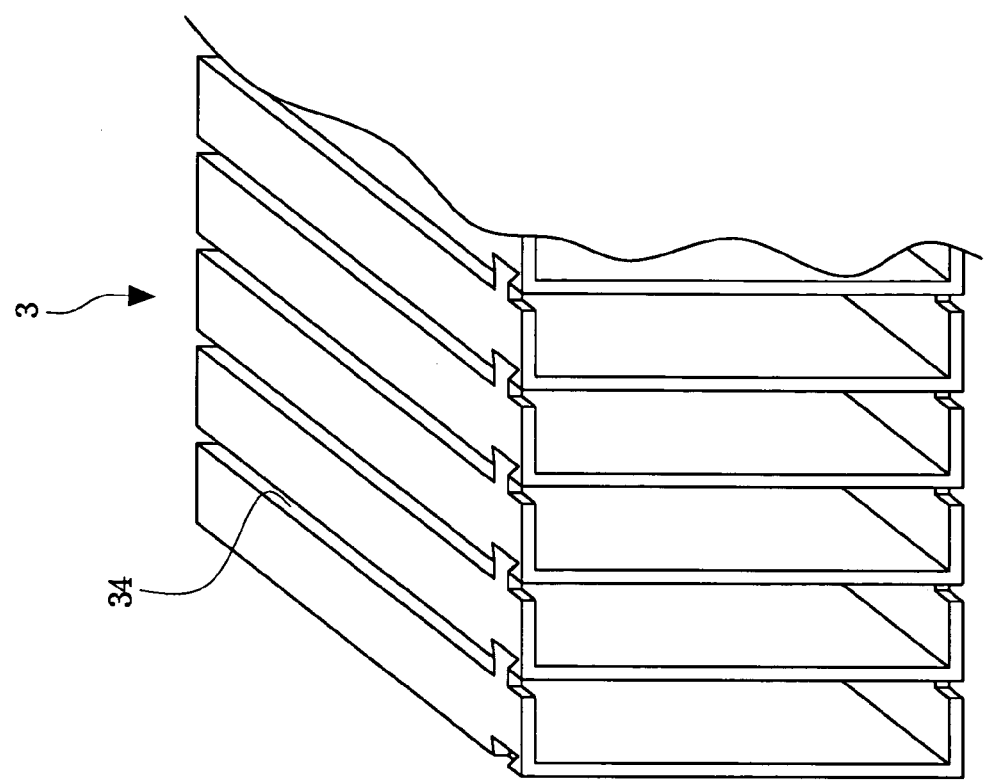
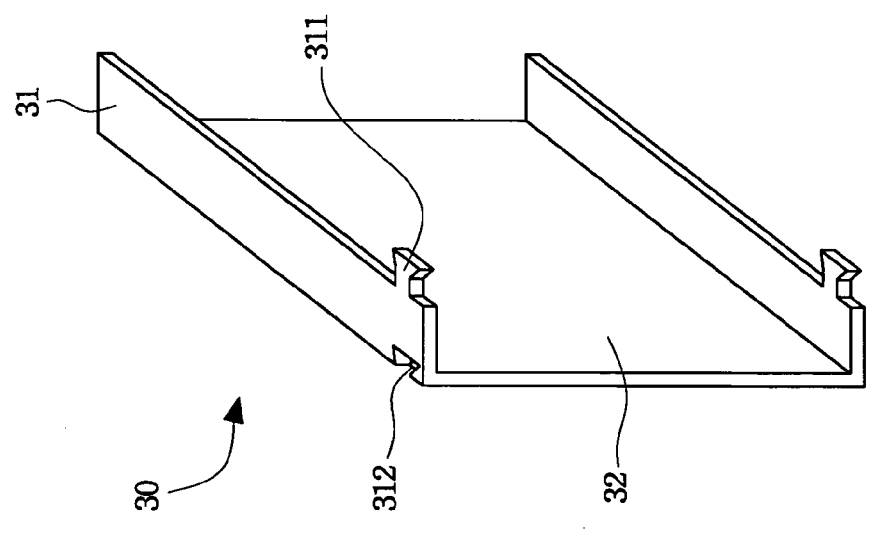
Fig. 5

EXTENDED FIN ARRAY

RELATED APPLICATIONS

The present application is based on, and claims priority from, Taiwan Application Serial Number 93113973, filed May 18, 2004, the disclosure of which is hereby incorporated by reference herein in its entirety.

BACKGROUND OF THE INVENTION

1. Field of Invention

The invention relates to a fin array and, in particular, to an extended fin array.

2. Related Art

As the computer core technology improves continuously, the operating speeds of electronic devices such as the front bus of the processor and the display chip are increasing, especially for laptop computers. However, the heat generated during the operation also increases. Limited by the internal space of the laptop computer, no large heat-dissipation system can be installed to remove heat generated by the laptop computer. To increase the efficiency, one has to solve the serious heat-dissipation problem.

As shown in FIG. 1, the conventional heat dissipation system of the laptop computer uses a fan 100 to blow cool air into the fin array 200, thereby removing the heat generated by the electronic devices. When the operations processed by the electronic devices increase, the electronic devices generate more heat. The only way to improve the heat-dissipation efficiency is to increase the speed of the fan. Although increasing the fan speed can enlarge the cool air flux for better heat dissipation, it often results in large annoying noises. Therefore, it is imperative to provide a method or structure that can effectively increase the heat convection area of the heat-dissipation module in order to quickly remove heat generated by electronic devices inside the laptop computer.

SUMMARY OF THE INVENTION

In view of the foregoing, an objective of the invention is to provide an extended fin array, which utilizes a specially designed stack and combination to increase the effective convective area for heat dissipation. In a conventional heat-dissipation system, simply increasing the fan speed results in large noises. The highly efficient extended fin array of the invention use a special fin structure to increase the heat-dissipation area of the heat-dissipation system. It can largely increase the heat convection area to quickly remove heat generated by electronic devices inside the laptop computer. Therefore, the invention can solve the heat-dissipation problem caused by high-speed electronic devices.

The disclosed extended fin array contains a main heat-dissipation module and an extended heat-dissipation module. The main heat-dissipation module is formed by combining main heat-dissipation bodies. The flat part on the main heat-dissipation module is in direct or indirect contact with the electronic devices to absorb heat. The extended heat-dissipation module is formed by combining extended heat-dissipation bodies. It is coupled to the main heat-dissipation module and moves along the fins inside the main heat-dissipation module, extending or returning according to the real situations. A fan is used to send in cool air to bring away the heat. The extended heat-dissipation module is in the main heat-dissipation module when the heat amount generated by an electronic device is normal. The extended heat-dissipation module extends out from the main heat-dissipation module to increase the heat convection area when the heat amount generated by the electronic device is large.

BRIEF DESCRIPTION OF THE DRAWINGS

These and other features, aspects and advantages of the invention will become apparent by reference to the following description and accompanying drawings which are given by way of illustration only, and thus are not limitative of the invention, and wherein:

FIG. 5 is an exploded three-dimensional view of the disclosed main heat-dissipation module and the main heat-dissipation bodies;

DETAILED DESCRIPTION OF THE PREFERRED EMBODIMENT

The present invention will be apparent from the following detailed description, which proceeds with reference to the accompanying drawings, wherein the same references relate to the same elements.

Figure 1:
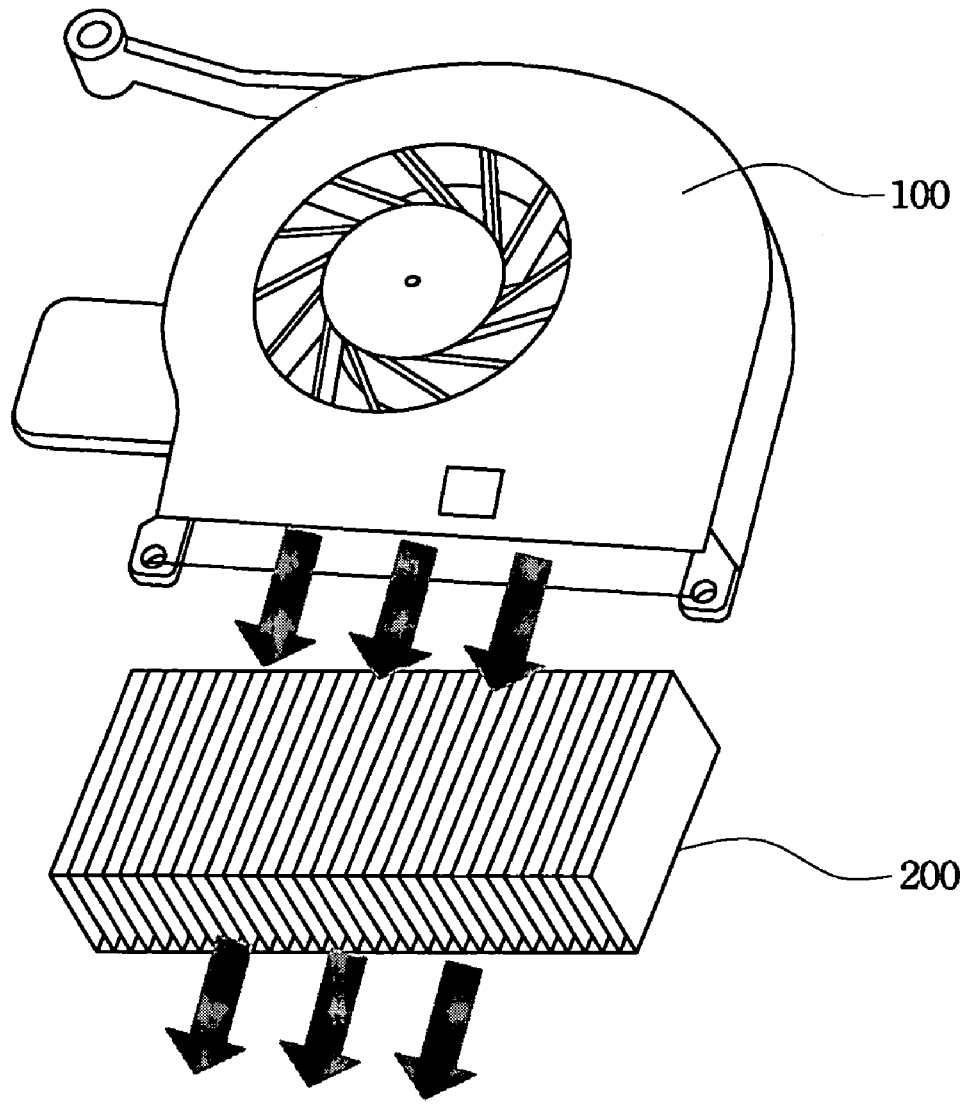
FIG. 1 is a schematic view of a conventional heat-dissipation fin array.
Figure 2:
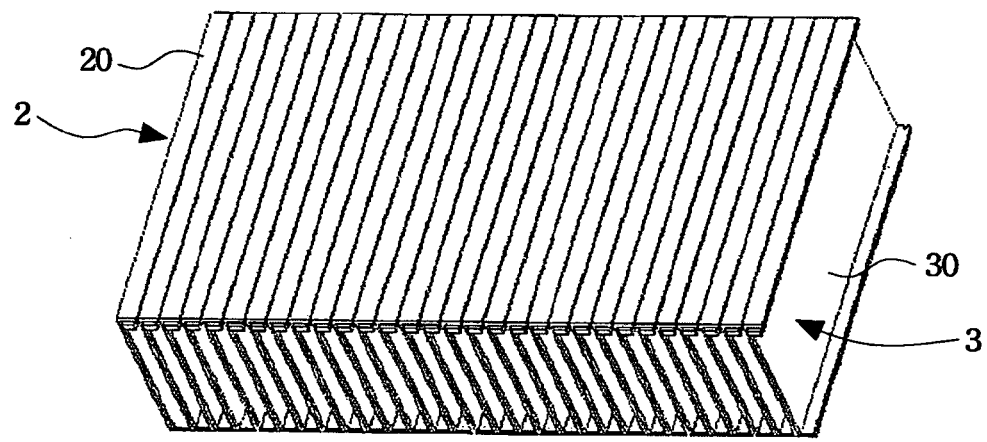
FIG. 2 is a three-dimensional view of the disclosed extended heat-dissipation fin array in its normal state.
Figure 3:
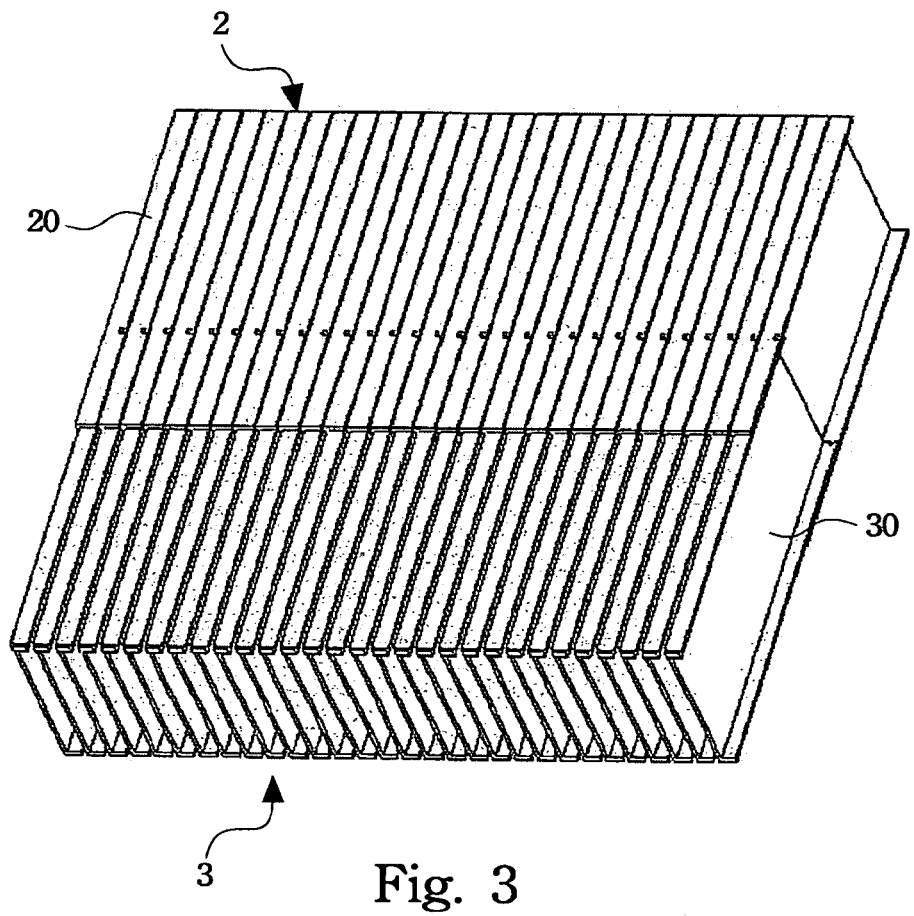
FIG. 3 is a three-dimensional view of the disclosed extended heat-dissipation fin array in its extended state.

As shown by FIGS. 2 and 3, the disclosed extended fin array contains a main heat-dissipation module 2 and an extended heat-dissipation module 3. The main heat-dissipation module 2 is formed by combining several main heat-dissipation bodies 20. The extended heat-dissipation module 3 is formed by combing several extended heat-dissipation bodies 30.

Figure 4:
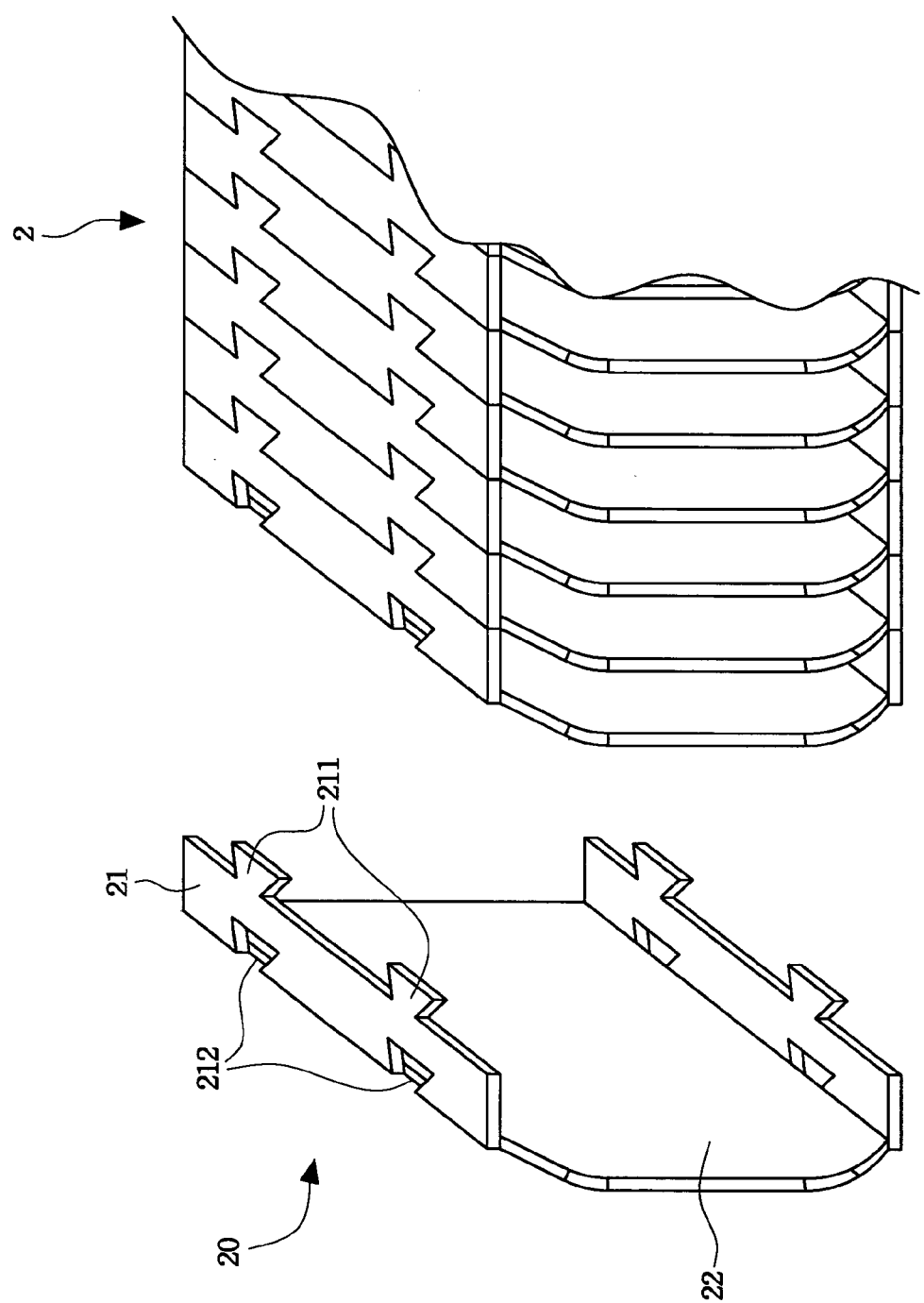
FIG. 4 is an exploded three-dimensional view of the disclosed main heat-dissipation module and the main heat-dissipation bodies.

With reference to FIG. 4, each main heat-dissipation body 20 contains a set of connecting plates 21 and a main heat-dissipation plate 22. The connecting plates 21 are connected to opposite sides of the main heat-dissipation plate 22. The connecting plates 21 are preferably perpendicular to the main heat-dissipation plate 22. One side of the connecting plate 21 that is close to the main heat-dissipation plate 22 is formed with a set of connecting grooves 212. The other side is formed with a set of connecting wedges 211. The connecting wedges 211 (or connecting grooves 212) are used to match and bolt to the connecting grooves 212 (or connecting wedges 211) of another main heat-dissipation body 20. According to the size and generated heat of the electronic device and the available space, one can freely adjust the number of main heat-dissipation bodies 20. Once the main heat-dissipation bodies 20 are connected, the connecting plates 21 form a large whole plane for direct or indirect contact with the electronic devices and for transmitting heat to the main heat-dissipation plate 22. Finally, the fan sends in cool air to the main heat-dissipation plate 22 to take away the heat.

As shown in FIG. 5, each extended main heat-dissipation body 30 contains a set of connecting plates 31 and an extended heat-dissipation plate 32. The connecting plates 31 are connected to opposite sides of the extended heat-dissipation plate 32. The connecting plates 31 are preferably perpendicular to the extended heat-dissipation plate 32. One side of the connecting plate 31 that is close to the extended heat-dissipation plate 32 is formed with a set of connecting grooves 312. The other side is formed with a set of connecting wedges 311. The connecting wedges 311 (or connecting grooves 312) are used to match and bolt to the connecting grooves 312 (or connecting wedges 311) of another extended heat-dissipation body 30. According to the size and generated heat of the electronic device and the available space, one can freely adjust the number of extended heat-dissipation bodies 30. Once the extended heat-dissipation bodies 30 are connected to form the extended heat-dissipation module 3, a gap 34 is formed between adjacent extended heat-dissipation bodies 30. The main heat-dissipation plate 22 extends into the gap so that the extended heat-dissipation module 3 can extend out from or return into the main heat-dissipation module 2.

A heat-conductive gel with a high heat-conductive coefficient is applied between the main heat-dissipation module 2 and the extended heat-dissipation module 3 as a heat-conduction medium. This enhances the heat transmission between the main heat-dissipation module 2 and the extended heat-dissipation module 3. The heat generated by the electronic devices is thus quickly transmitted to the extended heat-dissipation plates 32. The fan sends in cool air by the extended heat-dissipation plates 32 to take away the heat. The heat-conductive gel also functions as a lubricant for the extended heat-dissipation module 3.

The extended heat-dissipation module 3 is in the main heat-dissipation module when the heat amount generated by an electronic device is normal. The extended heat-dissipation module extends out from the main heat-dissipation module to increase the heat convection area when the heat amount generated by the electronic device is large, as shown by FIGS. 2 and 3.

Figure 6A:
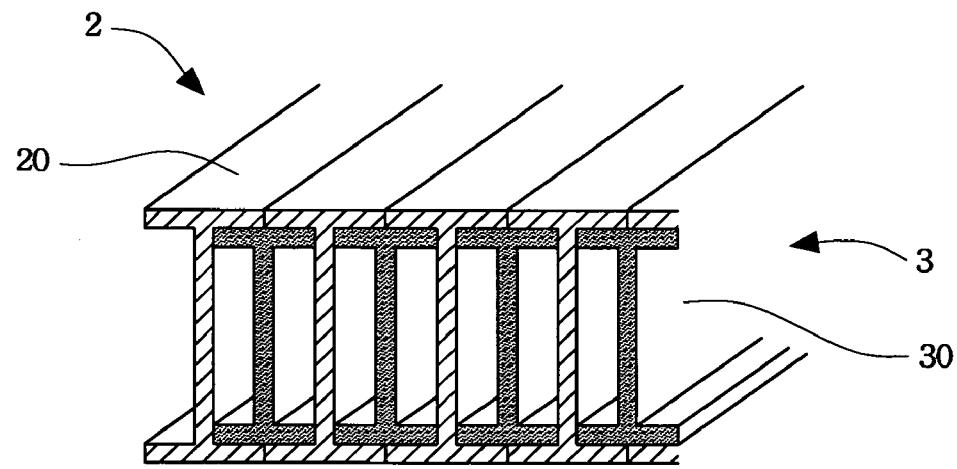
FIG. 6A is a cross-sectional view of the extended fin array composed of H-shape main heat-dissipation bodies and extended heat-dissipation bodies.
Figure 6B:
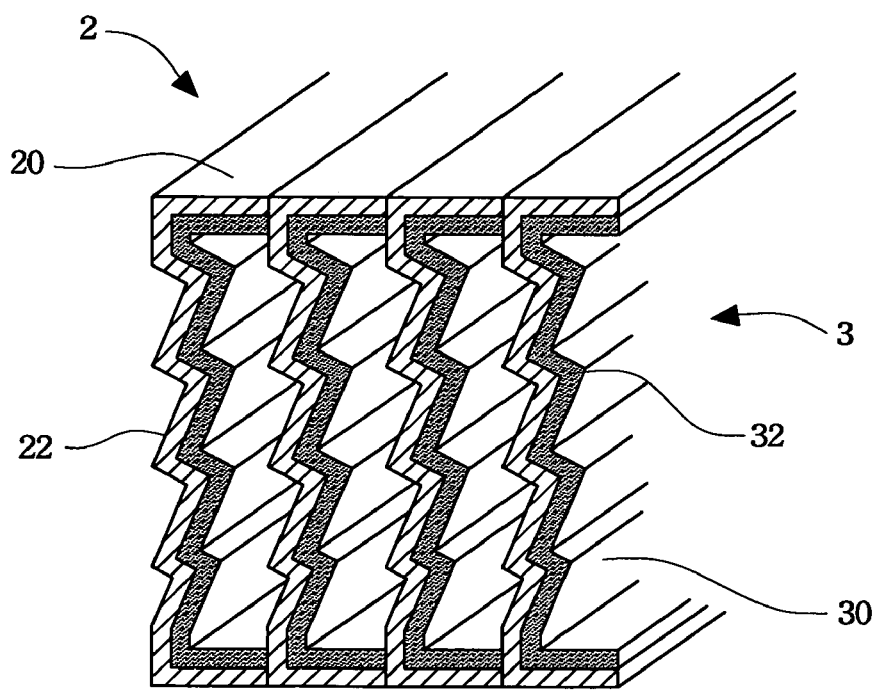
FIG. 6B is a cross-sectional view of the extended fin array composed of saw-shape main heat-dissipation bodies and extended heat-dissipation bodies.
Figure 6C:
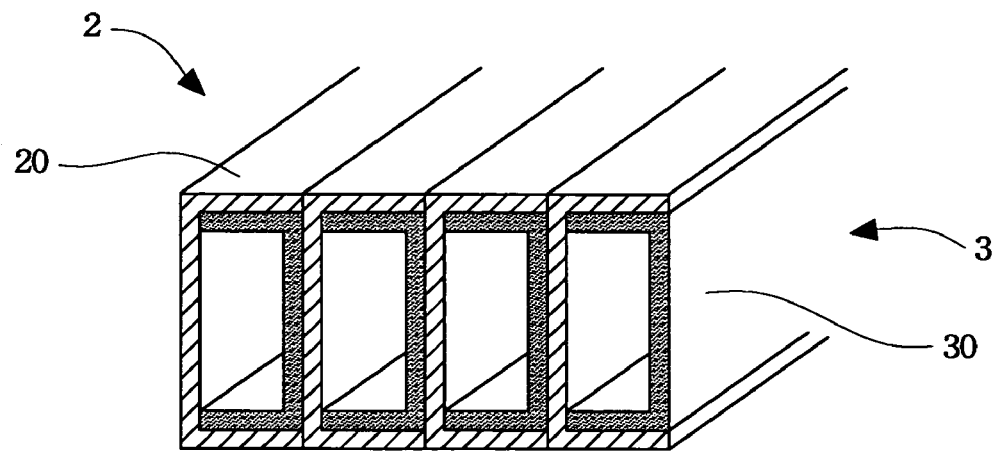
FIG. 6C is a schematic view of an extended fin array composed of the main heat-dissipation module and the extended heat-dissipation module coupled by having the U-shape openings face each other.
Figure 6D:
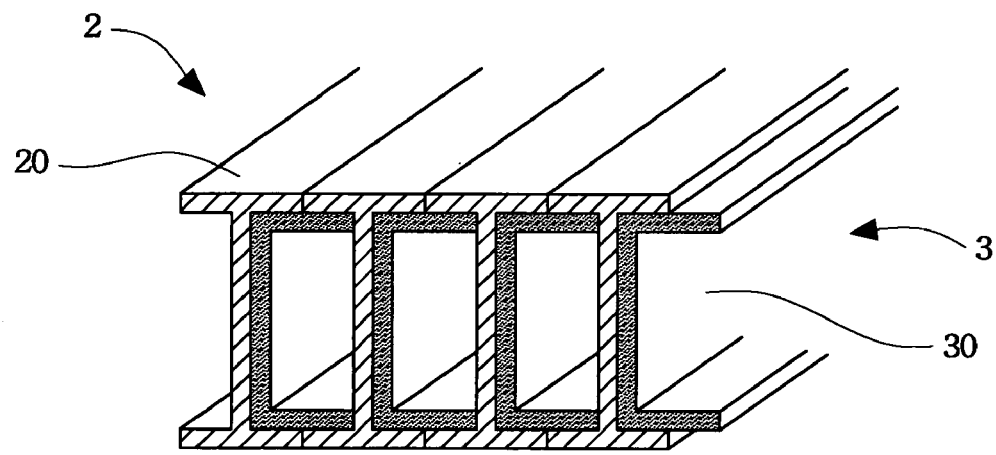
FIG. 6D is a schematic view of an extended fin array composed of main heat-dissipation bodies with an H cross-section and extended heat-dissipation bodies with a U cross-section.

The invention can have various kinds of applications For example, the material of the extended fin array includes all kinds of substances that are thermally conductive, solid, and easy for machining. Although the U-shape main heat-dissipation bodies 20 and extended heat-dissipation bodies 30 in FIGS. 4 and 5 are used to explain the invention, their shapes are actually not defined. The H-shape main heat-dissipation bodies 20 and extended heat-dissipation bodies 30 in FIG. 6A and the main heat-dissipation bodies 20 and extended heat-dissipation bodies 30 with a saw cross-section in FIG. 6B are all within the scope of the invention. The coupling between the main heat-dissipation bodies 20 and the extended heat-dissipation bodies 30 is not limited to that shown in FIGS. 2 and 3. The coupling means by having two U-shape heat-dissipation bodies facing each other in FIG. 6C or that in FIG. 6D are also considered to be within the scope of the invention. The two U-shape heat-dissipation bodies of FIG. 6C and FIG. 6D preferably face opposite directions. The shapes of the connecting wedges 211, 311, and the connecting grooves 212, 312 are not limited to the trapezoid shape shown in the drawing. Any shape that serves the function of connecting is consistent with the invention and included in the claims.

As described before, the invention has the following advantages:

1. It uses an extended heat-dissipation module to increase the heat convective area, thereby increasing the heat-dissipation efficiency.

2. The heat-dissipation efficiency is increased without increasing the fan speed; thus, the noise is reduced.

3. The number of heat-dissipation bodies is determined according to the size and produced heat of electronic devices and available space. There is no need to make molds for different situations. The manufacturing method is simple, and the products have wide applications.

While the invention has been described by way of example and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An extended fin array, comprising:
    a main heat-dissipation module, which is installed on an electronic device, the main heat-dissipation module being formed by connecting a plurality of main heat-dissipation bodies together, each of the main heat-dissipation bodies including:
        a main heat-dissipation plate, which transmits heat generated by the electronic device to cool air sent through by a fan, the main heat-dissipation plate being disposed in parallel to other main heat-dissipation plates; and
        main connecting plates, which are attached on both sides of the main heat-dissipation plate, for connecting the main heat-dissipation plate to the other main heat-dissipation plates, to thereby form the main heat-dissipation module; and
    an extended heat-dissipation module, which is stacked and intertwined with the main heat-dissipation module;
    wherein the extended heat-dissipation module is extendible out from or movable into the main heat-dissipation module, and the fan is used with the main heat-dissipation module and the extended heat-dissipation module to take heat away from the electronic device.

2. The extended fin array of claim 1, wherein each of the main connecting plates comprises:
    a connecting groove, which is formed on one side of the main connecting plate that is close to the main heat-dissipation plate; and
    a connecting wedge, which is formed on the other side of the main connecting plate for connecting with the connecting groove on another main heat-dissipation body so that the main connecting plates form a plane.

3. The extended fin array of claim 1, wherein the extended heat-dissipation module includes a plurality of extended heat-dissipation bodies connected together.

4. The extended fin array of claim 3, wherein each of the extended heat-dissipation bodies comprises:
    an extended heat-dissipation plate, which transmits heat generated by the electronic device to cool air sent through by the fan; and
    extended connecting plates, which are connected on both sides of the extended heat-dissipation plate for connecting the extended heat-dissipation plates to form the extended heat-dissipation module.

5. The extended fin array of claim 4, wherein each of the extended connecting plates comprises:
- a connecting groove, which is formed on one side of the extended connecting plate that is close to the extended heat-dissipation plate; and
- a connecting wedge, which is formed on the other side of the extended connecting plate for connecting with the connecting groove on another extended heat-dissipation body.

6. The extended fin array of claim 3, wherein a gap is formed between one extended heat-dissipation body and another extended heat-dissipation body for receiving a respective main heat-dissipation body so that the main heat-dissipation module and the extended heat-dissipation module are coupled.

7. The extended fin array of claim 1, further comprising a heat-conductive gel with a high thermal conductivity inserted between the main heat-dissipation module and the extended heat-dissipation module, the heat-conductive gel serving as a heat conduction medium for transferring heat, and serving as a lubricant when the extended heat-dissipation module is moved.

8. An extended fin array, comprising:
- a main heat-dissipation module, which is installed on an electronic device; and
- an extended heat-dissipation module, which is stacked and intertwined with the main heat-dissipation module, and including a plurality of extended heat-dissipation bodies connected together, each of the extended heat-dissipation bodies including:
  - an extended heat-dissipation plate, which transmits heat generated by the electronic device to cool air sent through by a fan; and
  - extended connecting plates, which are attached on both sides of the extended heat-dissipation plate for connecting the extended heat-dissipation plates to form the extended heat-dissipation module;
- wherein the extended heat-dissipation module is extendible out from or movable into the main heat-dissipation module, and the fan is used with the main heat-dissipation module and the extended heat-dissipation module to take heat away from the electronic device.

* * * * *